(12) United States Patent
Yang et al.

(10) Patent No.: US 10,342,134 B2
(45) Date of Patent: Jul. 2, 2019

(54) PRINTED CIRCUIT BOARD AND A METHOD OF BONDING ELECTRODE LEAD OF BATTERY TO PRINTED CIRCUIT BOARD

(71) Applicant: LG CHEM, LTD., Seoul (KR)

(72) Inventors: Jin Oh Yang, Gyeongsangbuk-Do (KR); Suk Jin Song, Gyeonggi-Do (KR); Young Su Son, Chungcheongbuk-Do (KR); Jae Young Jang, Chungcheongbuk-Do (KR)

(73) Assignee: LG Chem. Ltd., Seoul (KR)

( * ) Notice: Subject to any disclaimer, the term of this patent is extended or adjusted under 35 U.S.C. 154(b) by 0 days.

(21) Appl. No.: 15/900,031

(22) Filed: Feb. 20, 2018

(65) Prior Publication Data
US 2018/0242454 A1 Aug. 23, 2018

(30) Foreign Application Priority Data
Feb. 22, 2017 (KR) .......... 10-2017-0023351

(51) Int. Cl.
*H05K 1/18* (2006.01)
*H05K 1/11* (2006.01)
*H05K 3/34* (2006.01)
*H05K 3/40* (2006.01)
*H05K 1/02* (2006.01)

(52) U.S. Cl.
CPC ............ *H05K 1/18* (2013.01); *H05K 1/111* (2013.01); *H05K 3/3405* (2013.01); *H05K 3/3421* (2013.01); *H05K 3/3447* (2013.01); *H05K 3/4015* (2013.01); *H05K 1/0204* (2013.01); *H05K 2201/09072* (2013.01); *H05K 2201/10037* (2013.01); *H05K 2201/10901* (2013.01)

(58) Field of Classification Search
None
See application file for complete search history.

(56) References Cited

U.S. PATENT DOCUMENTS 9,693,456 B2 * 6/2017 Ozaki ................ H05K 1/0206
9,819,058 B2 * 11/2017 Kim .................. H01M 2/0404

FOREIGN PATENT DOCUMENTS

| KR | 100760784 B1 | * | 9/2007 | ......... H01M 10/42 |
| KR | 20110004281 A | * | 1/2011 | ......... H01M 2/021 |
| KR | 20110107523 A | * | 10/2011 | ......... H01M 2/10 |
| KR | 20140061149 A | * | 5/2014 | ......... H05K 1/14 |

* cited by examiner

*Primary Examiner* — Sarah A. Slifka
(74) *Attorney, Agent, or Firm* — Morgan, Lewis & Bockius LLP

(57) ABSTRACT

The present disclosure relates to a printed circuit board connected to a battery, and more particularly, to a printed circuit board having an improved structure connected to an electrode led out from a battery.

17 Claims, 5 Drawing Sheets

[Fig. 1]
Prior Art
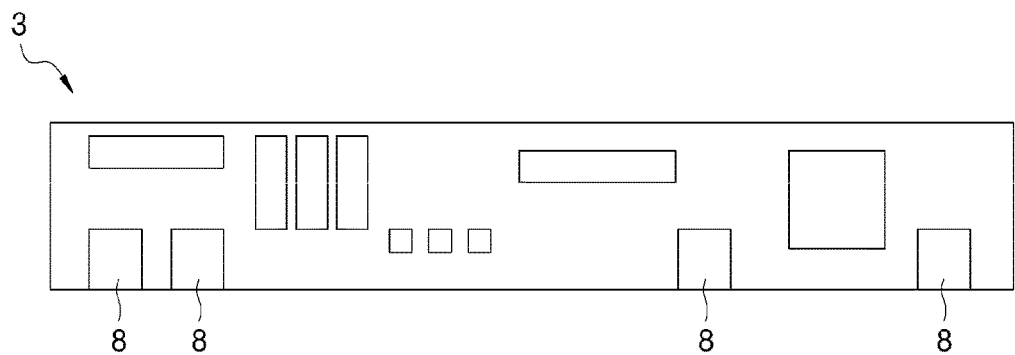
[Fig. 2]
Prior Art
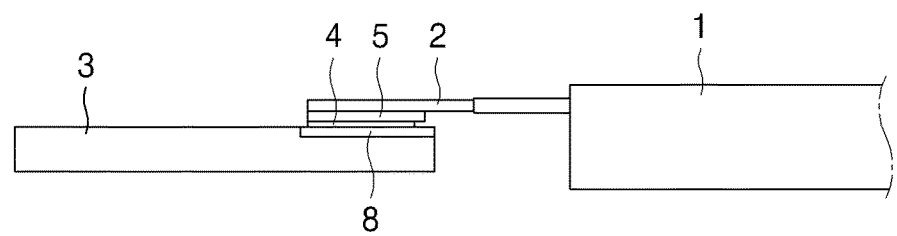
[Fig. 3]
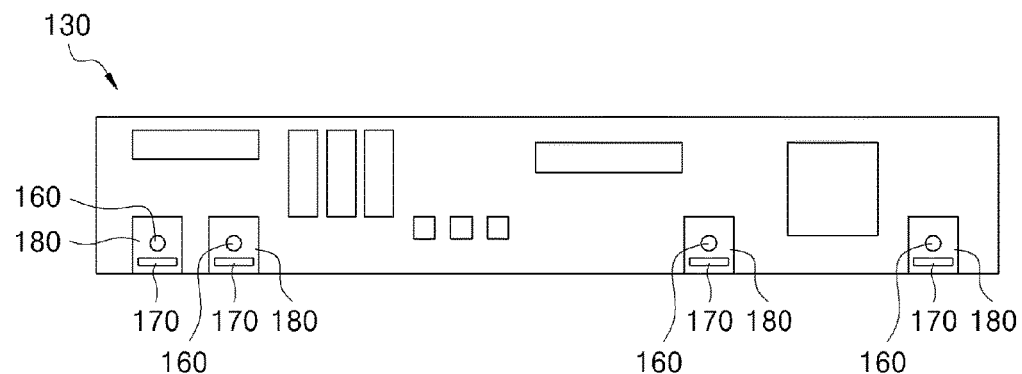

[Fig. 4]
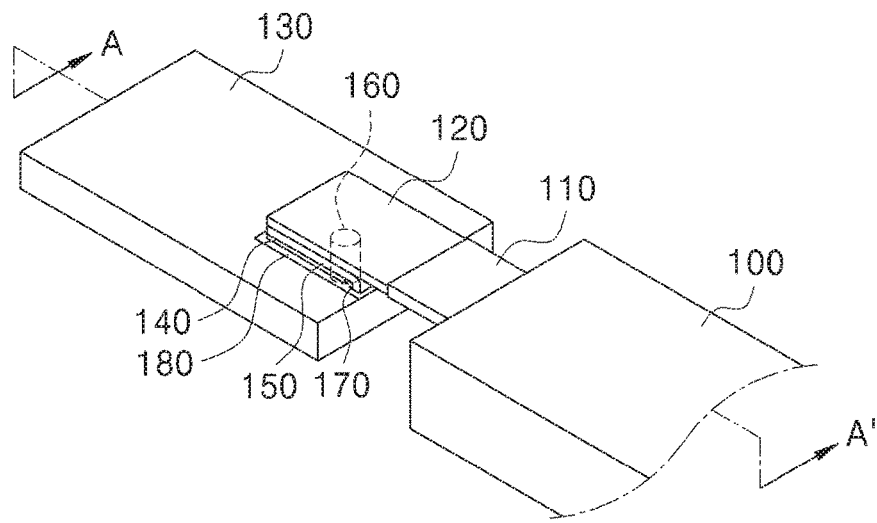
[Fig. 5]
A-A'
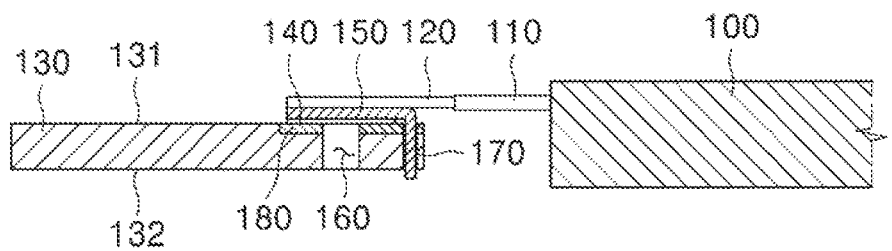
[Fig. 6]
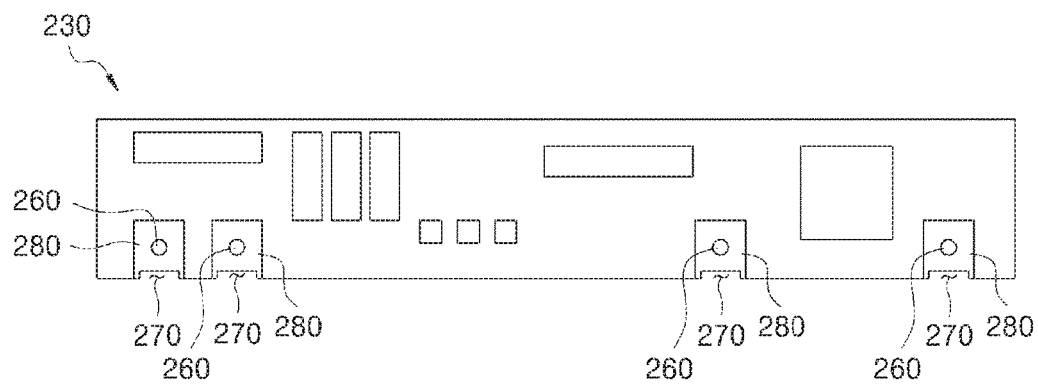

[Fig. 7]
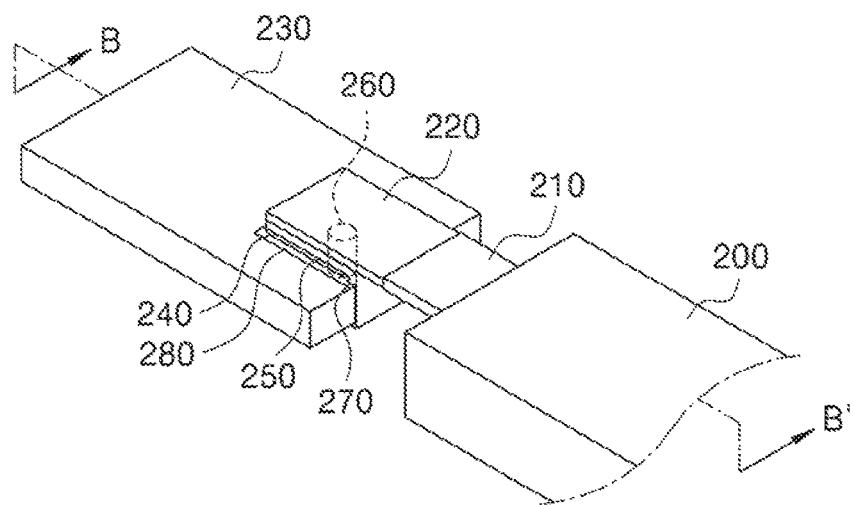
[Fig. 8]
B-B'
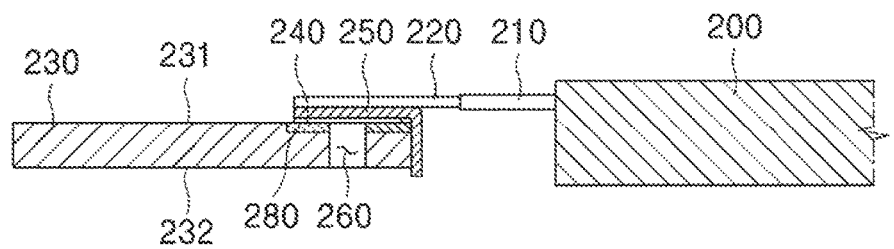
[Fig. 9]
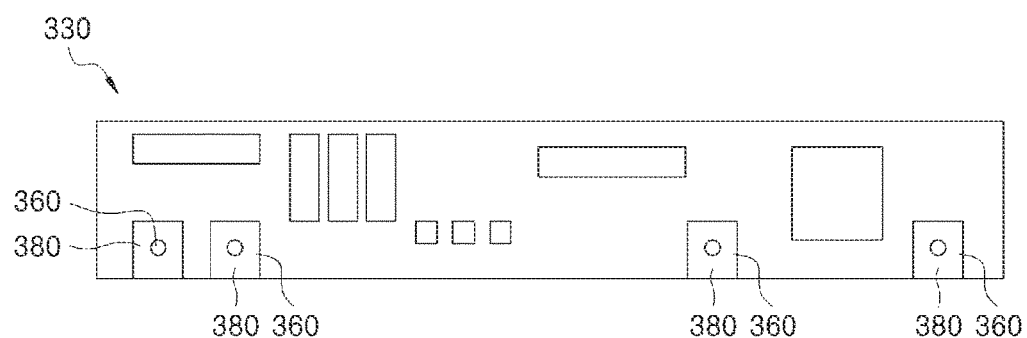

[Fig. 10]
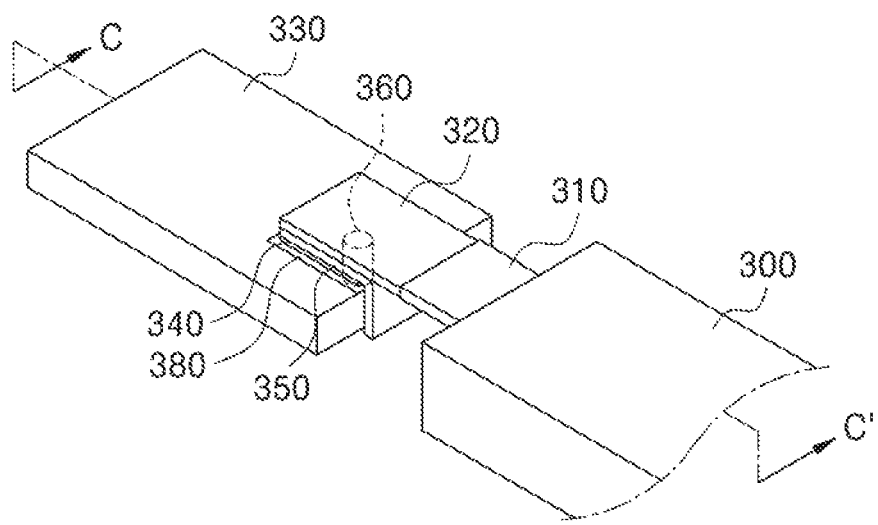
[Fig. 11]
C-C'
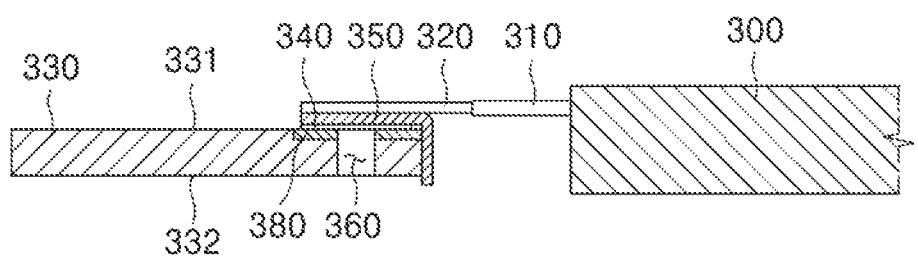

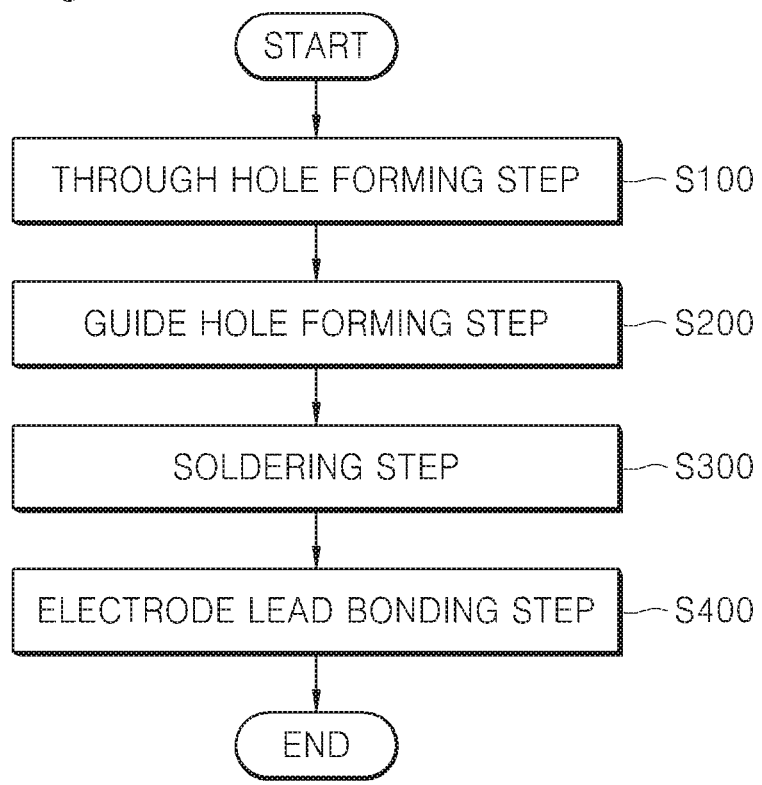
[Fig. 12]

PRINTED CIRCUIT BOARD AND A METHOD OF BONDING ELECTRODE LEAD OF BATTERY TO PRINTED CIRCUIT BOARD

CROSS-REFERENCE TO RELATED APPLICATION

This application claims priority to Korean Patent Application No. 10-2017-0023351 filed on Feb. 22, 2017 and all the benefits accruing therefrom under 35 U.S.C. § 119, the contents of which are incorporated by reference in their entirety.

BACKGROUND

The present disclosure relates to a printed circuit board connected to a battery, and more particularly, to a printed circuit board having an improved structure connected to an electrode led out from a battery.

Recently, the technology development and demand for mobile apparatuses, electric vehicles, hybrid vehicles, power storage devices, and uninterruptable power supply devices have increased, and thus, the demand for secondary batteries as energy sources have been rapidly increasing.

In particular, battery packs used for electric vehicles and hybrid vehicles are high-power, high-capacity secondary batteries, and much research thereon has been carried out.

In general, the secondary batteries mean chemical batteries which can be repeatedly charged and discharged by using reversible mutual conversion between chemical energy and electrical energy.

Since various flammable materials are contained in such secondary batteries and there is a danger of being heated, exploded, or the like due to overcharge, over-current, external physical shock, or the like, the secondary batteries have a drawback of having weak safety.

Accordingly, the secondary batteries are configured such that a battery cell is connected to a printed circuit board on which safety elements, such as a positive temperature coefficient (PTC) element or a protection circuit module, is mounted so as to effectively control abnormal states such as overcharge, over-current, or the like.

FIG. 1 is a plan view schematically illustrating a structure of a conventional printed circuit board, and FIG. 2 is a side cross-sectional view illustrating connection between a conventional printed circuit board and a battery.

Referring to FIGS. 1 and 2, a thin plate-shaped metal plate 5 is mounted on a connection part 8 of a printed circuit board 3, an electrode lead 2 of a battery 1 is stacked on the metal plate 5, and then the electrode lead 2 of the battery 1 is welded to the metal plate 5 to form connection.

At this point, as illustrated in FIG. 2, the region in which the metal plate 5 and the electrode lead 2 of the battery 1 are welded corresponds to the portion in which the metal plate 5 is mounted on the printed circuit board 3.

In general, when mounted on the printed circuit board 3, the metal plate 5 is bonded by soldering using a solder 4.

When the metal plate 5 and the electrode lead 2 of the battery are welded through such soldering, as described above, the welded region overlaps the soldering region, and thus, the solder 4 in the soldered portion is melted due to a temperature rise caused by electrical limitations such as unstable current or voltage during the welding.

In addition, such a melted solder is scattered around due to the pressure of a welder, and the solder scattered as such is also scattered to the electrode lead 2 of the battery 1 and unintentionally connected to the electrode lead 2 of the battery 1, and thus, there is a limitation in that a short circuit is caused.

To prevent such a limitation, there is a method of forming the metal plate to have a great thickness, but in this case, there is a drawback in that entire thickness increases due to the increase in the thickness of the metal plate, and the miniaturization and simplification of components cannot be achieved.

SUMMARY

The present disclosure provides a printed circuit board and a method for manufacturing the same, wherein the structure of the printed circuit board to which the battery electrode lead is connected and welded is improved, and a new-type metal plate is applied, and thus, a solder is prevented from being scattered when the electrode lead of the battery is welded to the metal plate.

In accordance with an exemplary embodiment, a printed circuit board configured to include a first surface and a second surface facing the first surface, the printed circuit board including: a plurality of connection parts connected with an electrode lead of a battery; through holes each formed on one side of the printed circuit board in a direction, in which the electrode lead of the battery is connected, in a region in which the connection parts are formed, the through holes being formed to pass through the printed circuit board from the first surface to the second surface; guide holes each passing through the printed circuit board from the first surface to the second surface in the region in which the connection parts are formed; and a metal plate soldered to the connection parts and having an upper surface to which the electrode lead of the battery is bonded.

The connection parts may be formed by conductors constituting circuits of the printed circuit board being exposed to the outside.

The through holes may be formed so that a lengthwise direction thereof is parallel to one side end portion of the printed circuit board, and lengths of the through holes may be formed longer than a width of a region in which the metal plate is soldered to the connection parts.

The guide holes may be formed in regions in which the through holes are not formed in the region in which the connection parts are formed.

The metal plate may be formed so that one end thereof is bent to be inserted into the through holes.

The metal plate may favorably have a thickness of 0.3 mm or less.

The metal plate may be formed to be wider than a width of the electrode of the battery.

The metal plate and the electrode lead of the battery may be bonded by spot welding.

In accordance with another exemplary embodiment, a method for bonding an electrode lead of a battery to a printed circuit board, the method includes: a through hole forming step of forming a through hole in a connection part of the printed circuit board; a guide hole forming step of forming a guide hole in the connection part; a soldering step of soldering a metal plate to the connection part; and an electrode lead bonding step of welding the electrode lead of the battery to the metal plate.

In the through hole forming step, the through hole may be formed on one side of the printed circuit board in a region in which the connection part is formed in a direction in which the electrode of the battery is connected so as to pass through the printed circuit board from a first surface to a second surface, and to have a lengthwise direction parallel to one end portion of the printed circuit board, and a length of the through hole may be formed longer than a width of a region in which the metal plate is soldered to the connection part.

In the guide hole forming step, the guide hole may be formed in a region in which the through hole is not formed in the region in which the connection part is formed, so as to pass through the printed circuit board from the first surface to the second surface.

In the soldering step, one end of the metal plate may be bent to be inserted into the through hole and be soldered to the connection part by means of a solder.

In the electrode lead bonding step, the metal plate and the electrode lead of the battery may be bonded by spot welding.

BRIEF DESCRIPTION OF THE DRAWINGS

The following drawings attached in this specification illustrate a preferred embodiment of the present invention and function to allow the technical spirit of the present invention to be further understood along with the detailed description of the invention. Therefore, the present invention should not be construed as being limited to only the drawings.

FIG. 1 is a plan view schematically illustrating a structure of a conventional printed circuit board;

FIG. 2 is a side cross-sectional view illustrating connection between a conventional printed circuit board and a battery;

FIG. 3 is a plan view schematically illustrating a printed circuit board in accordance with a first exemplary embodiment before a metal plate is mounted;

FIG. 4 is a perspective view illustrating connection between a battery and the printed circuit board in accordance with the first exemplary embodiment;

FIG. 5 is a cross-sectional view taken along line A-A' of FIG. 4;

FIG. 6 is a plan view schematically illustrating a printed circuit board in accordance with a second exemplary embodiment before a metal plate is mounted;

FIG. 7 is a perspective view illustrating connection between a battery and the printed circuit board in accordance with the second exemplary embodiment;

FIG. 8 is a cross-sectional view taken along line B-B' of FIG. 7;

FIG. 9 is a plan view schematically illustrating a printed circuit board in accordance with a third exemplary embodiment before a metal plate is mounted;

FIG. 10 is a perspective view illustrating connection between a battery and the printed circuit board in accordance with the third exemplary embodiment;

FIG. 11 is a cross-sectional view taken along line C-C' of FIG. 7; and

FIG. 12 is a flow chart illustrating a method for bonding a printed circuit board in accordance with an exemplary embodiment to an electrode lead of a battery.

* It is clarified that the attached drawings are illustrated as a reference for understanding the technical concept of the present invention, and the scope of the present invention is not limited by the drawings.

DETAILED DESCRIPTION OF EMBODIMENTS

It should be understood that words or terms used in the specification and claims shall not be interpreted as limited to general and dictionary meanings, but interpreted based on the meanings and concepts consistent with the technical aspects of the invention on the basis of the principle that the inventor may appropriately define the terms for the best explanation.

Therefore, the features of the embodiments and drawings described herein are merely the most preferable exemplary embodiment for the purpose of illustrations only, not intended to represent all the technical concepts of the disclosure, so it should be understood that various modifications and equivalents could be made thereto at the time of present application. Moreover, detailed description related to well-known arts or the like will be ruled out in order not to unnecessarily obscure subject matters of the present invention.

FIG. 3 is a plan view schematically illustrating a printed circuit board in accordance with a first exemplary embodiment before a metal plate is mounted, FIG. 4 is a perspective view illustrating a connection structure between a battery and the printed circuit board in accordance with the first exemplary embodiment, and FIG. 5 is a cross-sectional view taken along line A-A' of FIG. 4.

Referring to FIGS. 3 to 5, a printed circuit board 130 in accordance with the first exemplary embodiment includes: a plurality of connection parts 180 to which an electrode lead 120 of a battery 100 is connected; through holes 170 formed in regions in which the connection parts are formed; guide holes 160 formed in the regions in which the connecting parts are formed; and a metal plate 150 connected to the electrode lead 120 of the battery 100 through welding.

The connection parts 180 are formed by a conductive body constituting a circuit of the printed circuit board 130 being exposed to the outside and functions as a terminal connecting the circuit and the battery.

In addition, the printed circuit board 130 may include a protective circuit module (not shown) and the like used in a secondary battery.

In addition, the metal plate 150 is soldered to the connection parts 180 by means of a solder 140, and then, the electrode lead 120 of the battery is welded to the metal plate 150 such that the printed circuit board 130 and the battery 100 are electrically connected to each other.

The through holes 170 are formed on one side of the printed circuit board 130 in the regions, in which the connection parts 180 are formed, in the direction in which the electrode lead 120 of the battery is connected, so as to pass through a first surface 131 and a second surface 132 of the printed circuit board 130.

Through holes which uprightly pass through the printed circuit board 130 are described, but the shape thereof are not limited thereto.

In addition, the through holes 170 are favorably formed such that the lengthwise direction thereof is parallel to one end portion of the printed circuit board 130.

In addition, the lengths of the through holes 170 are favorably formed to be longer than the width of a region in which the metal plate 150 is soldered to the connection parts 180 by means of the solder 140.

The guide holes 160 are formed to pass through the first surface 131 and the second surface 132 in the regions in which the connection parts 180 are formed.

In the drawings, the guide holes 160 are illustrated to uprightly pass through the first surface 131 and the second surface 132, but exemplary embodiments are not limited thereto.

In addition, the guide holes 160 are favorably formed in the region in which the connection parts 180 are formed and in which the through holes 170 are not formed.

The guide holes 160 function to discharge heat generated when the metal plate 150 soldered to the connection parts 180 is welded to the electrode lead 120 of the battery.

In addition, the guide holes 160 also function to guide, toward the inside thereof, the solder scattered by heat and pressure when the electrode lead 120 of the battery is welded to the metal plate 150.

The guide holes 160 may be formed in cylindrical shapes and square shapes, but the shapes thereof are not particularly limited.

The metal plate 150 is mounted on the connection parts 180 and functions to electrically connect the battery 100 and the printed circuit board 130 by being welded with the electrode lead 120 of the battery.

As illustrated in the drawings, the metal plate 150 is prepared in a state in which one side end portion thereof is bent in an "L" shape. The metal plate is formed of a nickel material in consideration of a welding property.

In addition, the metal plate 150 is formed in a thin-plate shape made of a metal material, and the thickness thereof is favorably formed to be 0.3 mm or less.

The metal plate 150 is mounted on the connection parts 180 through soldering using the solder 140. At this point, the metal plate 150 is mounted on the connection parts 180 so that one end thereof bent in the "L" shape is inserted into the through holes 170.

Therefore, the metal plate 150 is mounted on the connection parts 180 in a shape overlapping the connection parts 180, and has a shape in which a blocking wall is formed between the region soldered by means of the solder 140 and the battery 100.

In addition, as illustrated in the drawings, the region in which the metal plate 150 is soldered to the connection parts 180 by means of the solder 140, and the region in which the metal plate 150 is welded to the electrode lead 120 of the battery have shapes overlapping each other.

In addition, when the metal plate 150 and the electrode lead 120 of the battery are welded, for example, spot welding is preferred, and the metal plate 150 is favorably formed larger than the width of the electrode lead 120 of the battery.

Meanwhile, a high temperature due to the spot welding is transferred to the soldered region located under the metal plate 150, and the solder 140 in the soldered region is melted due to a rise in the temperature caused by electrical limitations such as unstable current or voltage during welding.

At this point, although the melted solder may be scattered by the pressure of a welder, the solder scattered toward the electrode lead 120 of the battery may be blocked to prevent a short circuit by virtue of the structure in which the metal plate 150 is bent in the "L" shape.

FIG. 6 is a plan view schematically illustrating a printed circuit board in accordance with a second exemplary embodiment before a metal plate is mounted, FIG. 7 is a perspective view illustrating a connection structure between a battery and the printed circuit board in accordance with the second exemplary embodiment, and FIG. 8 is a cross-sectional view taken along line B-B' of FIG. 7.

Referring to FIGS. 6 to 8, in a printed circuit board 230 in accordance with the second exemplary embodiment, one side of each of connection parts 280 is cut toward the inside of the printed circuit board 230, and thus, a penetrating groove 270 is formed.

The length of the penetrating groove 270 is favorably formed to be longer than the width of region in which the metal plate 250 is soldered with the connection parts 280 by means of a solder 240.

The metal plate 250 is mounted on the connection parts 280 through soldering using the solder 240.

Since the metal plate 250 is the same as those illustrated in FIGS. 3 to 5 except that the metal plate 250 is mounted on the connection parts 280 so that one end thereof bent in an "L" shape is inserted into the penetrating groove 270, detailed descriptions thereon will not be provided herein.

FIG. 9 is a plan view schematically illustrating a printed circuit board in accordance with a third exemplary embodiment before a metal plate is mounted, FIG. 10 is a perspective view illustrating a connection structure between a battery and the printed circuit board in accordance with the third exemplary embodiment, and FIG. 11 is a cross-sectional view taken along line C-C' of FIG. 10.

Referring to FIGS. 9 to 11, in a printed circuit board 330 in accordance with the third exemplary embodiment, a metal plate 350 is mounted on each of connection parts 380 through soldering using a solder 240.

Since the metal plate 350 is the same as those illustrated in FIGS. 3 to 5 except that the metal plate 350 is mounted on the connection part 380 so that one end thereof bent in a "L" shape contacts a side surface part of the printed circuit board 330, detailed descriptions thereon will not be provided herein.

Hereinafter a method for bonding an electrode of a battery to a printed circuit board in accordance of an exemplary embodiment will be described.

FIG. 12 is a flow chart illustrating a method for bonding an electrode lead of a battery to a printed circuit board in accordance with an exemplary embodiment.

Referring to FIG. 12, a method for bonding an electrode lead of a battery to a printed circuit board in accordance with an exemplary embodiment includes: a through-hole forming step S100 in which a through hole is formed in a connection part of the printed circuit board; a guide-hole forming step S200 in which a guide hole is formed in the connection part; a soldering step S300 in which a metal plate is soldered to the connection part; and an electrode lead bonding step S400 in which the electrode of the battery is welded to the metal plate.

In the through-hole forming step S100, the through hole passes through a first surface and a second surface of the printed circuit board on one side of the printed circuit board in the direction in which the electrode of the battery is connected in a region in which the connection part is formed.

In addition, the through hole is formed such that the lengthwise direction thereof is parallel to one side end portion of the printed circuit board.

In addition, the length of the through hole may be formed longer than the width of a region in which the metal plate is soldered to the connection part.

In the guide-hole forming step S200, the guide hole is formed in the connection part and formed to pass through the printed circuit board from the first surface to the second surface in a region in which the through hole is not formed in the region in which the connection part is formed.

In the soldering step S300, one end of the metal plate is bent in an "L" shape and inserted into the through hole, and the metal plate and the connection part are soldered by means of the solder.

In addition, the thickness of the metal plate is favorably formed to be 0.3 mm or less.

In the electrode lead bonding step S400, the metal plate and the electrode lead of the battery are bonded through welding, and favorably, through spot welding.

In accordance with an exemplary embodiment, since the structure of a printed circuit board is improved such that one end of a metal plate mounted on the printed circuit board is bent and can be inserted into a through hole formed in the printed circuit board, short circuits caused by a solder scattered due to the damage of a soldering joint part during welding may thereby be prevented, and since the thickness of the metal plate can be maintained to be thin, an effect of achieving the miniaturization and simplification of entire components is exhibited.

It should be noted that the present disclosure is not limited to foregoing embodiments, and a person skilled in the art may carry out various modifications and changes, which fall within the scope of claims set forth herein.

What is claimed is:

1. A printed circuit board configured to include a first surface and a second surface facing the first surface, the printed circuit board comprising:
   a board;
   a plurality of connection parts on the board, each configured to be electrically connected with an electrode lead of a battery;
   through holes each on one side of the board on a side from which the electrode lead of the battery is connected, each through hole passing through a respective one of the connection parts and through the board from the first surface to the second surface in a region in which the respective connection part is disposed;
   guide holes each passing through a respective one of the connection parts and through the board from the first surface to the second surface in the region in which the respective connection part is disposed; and
   a plurality of metal plates each soldered to a respective one of the connection parts and having an upper surface to which the electrode lead of the battery is bonded,
   wherein at least one through hole and at least one guide hole pass through each connection part.

2. The printed circuit board of claim 1, wherein the connection parts are formed by conductors constituting circuits of the printed circuit board being exposed to the outside.

3. The printed circuit board of claim 1, wherein the through holes have an elongated shape so that:
   a lengthwise direction thereof is parallel to the one side of the board, and
   lengths of the through holes are longer than a width of the metal plate soldered to the connection parts.

4. The printed circuit board of claim 1, wherein the guide holes are in regions in which the through holes are not formed.

5. The printed circuit board of claim 1, wherein each metal plate has one end bent, and the one end is inserted into a respective one of the through holes.

6. The printed circuit board of claim 1, wherein each metal plate has a thickness of 0.3 mm or less.

7. The printed circuit board of claim 1, wherein each metal plate is to be wider than a width of the electrode of the battery.

8. The printed circuit board of claim 1, wherein each metal plate and the respective electrode lead of the battery are bonded by spot welding.

9. The printed circuit board of claim 1, wherein each of the plurality of metal plates covers a respective one of the through holes, and each of the plurality of metal plates includes a portion inserted into a respective one of the guide holes.

10. The printed circuit board of claim 1, wherein the through holes are configured to guide solder to an inside of the board when the electrode lead of the battery is bonded to the metal plate.

11. A method for bonding an electrode lead of a battery to a printed circuit board, the method comprising:
    forming a through hole through a connection part on a board of the printed circuit board and through the board;
    forming a guide hole through the connection part and through the board;
    soldering a metal plate to the connection part; and
    welding the electrode lead of the battery to the metal plate,
    wherein at least one through hole and at least one guide hole are formed through each connection part.

12. The method of claim 11, wherein the through hole is formed on one side of the board in a region where the connection part is formed to pass through the board from a first surface to a second surface, and to have an elongated shape with a lengthwise direction parallel to the one side, and
    a length of the through hole is formed longer than a width of the metal plate soldered to the connection part.

13. The method of claim 11, wherein the guide hole is formed in a region in which the through hole is not formed in a region in which the connection part is formed to pass through the board from a first surface to a second surface.

14. The method of claim 11, wherein one end of the metal plate is bent, and the one end is inserted into the through hole, and wherein the metal plate is soldered to the connection part.

15. The method of claim 11, wherein the metal plate and the electrode lead of the battery are bonded by spot welding.

16. The method of claim 11, wherein each of the plurality of metal plates covers a respective one of the through holes, and each of the plurality of metal plates includes a portion inserted into a respective one of the guide holes.

17. The method of claim 11, wherein the through holes are configured to guide solder to an inside of the board when the electrode lead of the battery is welded to the metal plate.

* * * * *